US010643503B2

(12) United States Patent
Mao

(10) Patent No.: US 10,643,503 B2
(45) Date of Patent: May 5, 2020

(54) MOTHERBOARD AND MANUFACTURING METHOD THEREOF, COVER PLATE AND MANUFACTURING METHOD THEREOF, AND DISPLAY DEVICE

(71) Applicant: BOE TECHNOLOGY GROUP CO., LTD., Beijing (CN)

(72) Inventor: Xue Mao, Beijing (CN)

(73) Assignee: BOE TECHNOLOGY GROUP CO., LTD., Beijing (CN)

( * ) Notice: Subject to any disclaimer, the term of this patent is extended or adjusted under 35 U.S.C. 154(b) by 0 days.

(21) Appl. No.: 15/743,474

(22) PCT Filed: Jul. 21, 2017

(86) PCT No.: PCT/CN2017/093829
§ 371 (c)(1),
(2) Date: Jan. 10, 2018

(87) PCT Pub. No.: WO2018/129901
PCT Pub. Date: Jul. 19, 2018

(65) Prior Publication Data
US 2019/0080634 A1 Mar. 14, 2019

(30) Foreign Application Priority Data

Jan. 12, 2017 (CN) .......................... 2017 1 0020981

(51) Int. Cl.
*G09F 9/30* (2006.01)
*G02F 1/1333* (2006.01)
(Continued)

(52) U.S. Cl.
CPC ........ *G09F 9/301* (2013.01); *G02F 1/133305* (2013.01); *G02F 2001/133325* (2013.01);
(Continued)

(58) Field of Classification Search
CPC ...... G09F 9/301; G09F 9/33; G02F 1/133305; G02F 2001/133325; G02F 2202/28; H01L 51/0097
See application file for complete search history.

(56) References Cited

U.S. PATENT DOCUMENTS 6,120,130 A * 9/2000 Hirano ..................... B41J 2/005
347/46
6,204,902 B1 * 3/2001 Kim .................. G02F 1/133305
349/112
(Continued)

FOREIGN PATENT DOCUMENTS

CN 203360361 U 12/2013
CN 103631409 A 3/2014
(Continued)

OTHER PUBLICATIONS

Search Report and Written Opinion dated Oct. 25, 2017 from State Intellectual Property Office of the P.R. China.
First Chinese Office Action dated Sep. 28, 2018.

*Primary Examiner* — Sejoon Ahn
(74) *Attorney, Agent, or Firm* — Dilworth & Barrese, LLP.; Michael J. Musella, Esq.

(57) ABSTRACT

A motherboard and a manufacturing method thereof, a cover plate and a manufacturing method thereof, and a display device are provided. The manufacturing method of the motherboard includes: forming an ink pattern layer on a base substrate, the ink pattern layer including a plurality of hollow regions; applying a curable liquid onto the base substrate to cover the ink pattern layer; and curing the curable liquid to form a cured layer covering the ink pattern layer.

10 Claims, 4 Drawing Sheets

(51) Int. Cl.
    *G09F 9/33* (2006.01)
    *H01L 51/00* (2006.01)
(52) U.S. Cl.
    CPC ............ *G02F 2202/28* (2013.01); *G09F 9/33* (2013.01); *H01L 51/0097* (2013.01)

(56) References Cited

U.S. PATENT DOCUMENTS

| | | | |
|---|---|---|---|
| 2005/0162606 A1* | 7/2005 | Doane | G02F 1/133305 349/158 |
| 2006/0099328 A1* | 5/2006 | Waite | B82Y 30/00 427/58 |
| 2006/0131703 A1* | 6/2006 | Majumdar | H01L 51/0022 257/665 |
| 2011/0242020 A1* | 10/2011 | Kang | G06F 3/044 345/173 |
| 2013/0148046 A1* | 6/2013 | Chang | G02F 1/1313 349/15 |
| 2014/0054145 A1 | 2/2014 | Chi et al. | |
| 2014/0145158 A1* | 5/2014 | Choi | H01L 27/3246 257/40 |
| 2014/0152608 A1* | 6/2014 | Peng | G06F 3/044 345/174 |
| 2015/0079707 A1* | 3/2015 | Lee | H01L 51/5253 438/26 |
| 2015/0309628 A1* | 10/2015 | Chen | G02F 1/133305 428/68 |
| 2016/0109998 A1* | 4/2016 | Watanabe | G06F 3/0412 349/12 |
| 2016/0320878 A1* | 11/2016 | Hong | G06F 3/044 |
| 2016/0327713 A1* | 11/2016 | Li | B29D 11/00644 |

FOREIGN PATENT DOCUMENTS

| | | |
|---|---|---|
| CN | 103730067 A | 4/2014 |
| CN | 203689475 U | 7/2014 |
| CN | 204010550 U | 12/2014 |
| CN | 105045436 A | 11/2015 |
| CN | 204990231 U | 1/2016 |
| CN | 105335027 A | 2/2016 |
| CN | 205281983 U | 6/2016 |
| CN | 106782094 A | 5/2017 |
| JP | 2013088455 A | 5/2013 |

* cited by examiner

MOTHERBOARD AND MANUFACTURING METHOD THEREOF, COVER PLATE AND MANUFACTURING METHOD THEREOF, AND DISPLAY DEVICE

TECHNICAL FIELD

Embodiments of the present invention relate to a motherboard and a manufacturing method thereof, a cover plate and a manufacturing method thereof, and a display device.

BACKGROUND

Flexible display devices have attracted extensive attentions due to their advantages of light, thin, crash-proof and freely bendable, or the like. In order to realize bendable or even foldable display of a flexible display device, the thickness of its assembly structure needs to be minimized to meet the demand for smaller bending radii.

SUMMARY

Embodiments of the present disclosure provide a motherboard including a plurality of cover plates to be segmented and a manufacturing method thereof, a cover plate including a curable layer and a manufacturing method thereof, and a display device. The embodiments of the present invention can avoid air bubbles of the adhesive layer on the upper surface of the cover plate resulted from the drop in level of the decoration ink edges. A thinner adhesive layer can be used to bond the cover plate and the display panel to avoid the increasing of the thickness of the display assembly.

In one aspect, embodiments of the present invention provide a manufacturing method of a motherboard, comprising: forming an ink pattern layer on a base substrate, the ink pattern layer comprising a plurality of hollow regions; applying a curable liquid onto the base substrate to cover the ink pattern layer; and curing the curable liquid to form a cured layer covering the ink pattern layer.

For example, the curable liquid is applied using a coating process.

For example, the coating process comprises any one of slit coating process, spraying process, and spin coating process.

For example, the curable liquid is photo-curable, and the curable liquid is cured by UV irradiation to form the cured layer covering the ink pattern layer; or, the curable liquid is heat curable, and the curable liquid is cured by heating to form the cured layer covering the ink pattern layer.

For example, the ink pattern layer is formed on the base substrate using a decoration process, which comprises any process of ink screen printing, heat transfer printing, electroplating, and wire drawing.

For example, the method further comprises forming a protective layer on the cured layer, the protective layer comprising an anti-fingerprint-and-scratch layer and an anti-reflection layer.

For example, the whole surface of the cured layer away from the base substrate is planar.

In a second aspect, embodiments of the present invention also provide a motherboard, comprising: a base substrate; an ink pattern layer provided on the base substrate, the ink pattern layer comprising a plurality of hollow regions; and a cured layer provided on the base substrate and covers the ink pattern layer.

In a third aspect, embodiments of the present invention also provide a manufacturing method of cover plates, comprising: cutting the motherboard to form a plurality of cover plates.

In a fourth aspect, embodiments of the present invention also provide a cover plate, comprising: a base substrate; an ink pattern provided in the border region of the base substrate; and a cured layer provided on the base substrate to cover the ink pattern.

For example, the base substrate is flexible.

For example, the flexible base substrate is a polarizer.

For example, the flexible base substrate comprise at least one material selected from the group consisting of polyethylene terephthalate, polycarbonate, triacetate cellulose, cycloolefin polymer, polyimide, and polyethylene naphthalate two formic acid glycolester.

For example, the base substrate has a thickness in a range of 5~500 μm.

For example, the ink pattern has a thickness in a range of 5~50 μm.

For example, the cured layer comprises at least one material selected from the group consisting of polymethyl methacrylate, polyethylene terephthalate, polyurethane, silicone, and organic composite materials.

In a fifth aspect, embodiments of the present invention also provide a display device, comprising: a display panel; the cover plate; and an adhesive layer configured to bond the cover plate and the display panel, the adhesive layer being provided on a side of the base substrate in the cover plate away from the ink pattern.

BRIEF DESCRIPTION OF THE DRAWINGS

In order to demonstrate clearly technical solutions of the embodiments of the present disclosure, the accompanying drawings in relevant embodiments of the present disclosure will be introduced briefly. It is apparent that the drawings may only relate to some embodiments of the disclosure and not intended to limit the present disclosure.

REFERENCE NUMERALS

01—Motherboard; 100—Cover plate; 101—border region; 10—Base substrate; 10a—Upper surface; 10b—Lower surface; 20—Ink pattern layer; 20a—Ink pattern; 21—First extending section; 22—Second extending section; 30—Cured layer.

DETAILED DESCRIPTION

In order to make objects, technical details and advantages of the embodiments of the disclosure apparent, the technical solutions of the embodiment will be described in a clearly and fully understandable way in connection with the drawings related to the embodiments of the disclosure. It is apparent that the described embodiments are just a part but not all of the embodiments of the disclosure. Based on the described embodiments herein, those skilled in the art can obtain other embodiment(s), without any creative work, which shall be within the scope of the disclosure.

Unless otherwise defined, all the technical and scientific terms used herein have the same meanings as commonly understood by one of ordinary skill in the art to which the present disclosure belongs. The terms, such as "first," "second," or the like, which are used in the description and the claims of the present disclosure, are not intended to indicate any sequence, amount or importance, but for distinguishing various components. The terms, such as "comprise/comprising," "include/including," or the like are intended to specify that the elements or the objects stated before these terms encompass the elements or the objects and equivalents thereof listed after these terms, but not preclude other elements or objects. The terms, such as "connect/connecting/connected," "couple/coupling/coupled" or the like, are not limited to a physical connection or mechanical connection, but may include an electrical connection/coupling, directly or indirectly. The terms, "on," "under," "left," "right," or the like are only used to indicate relative position relationship, and when the position of the object which is described is changed, the relative position relationship may be changed accordingly.

The actual thicknesses of various film layers in the cover plate involved in embodiments of the present invention are tiny, for purpose of clarity, unless otherwise the thicknesses of the film layers are exaggerated in the accompanying drawings of the embodiments and are not intended to represent actual thicknesses and scale, unless otherwise specified.

Figure 1:
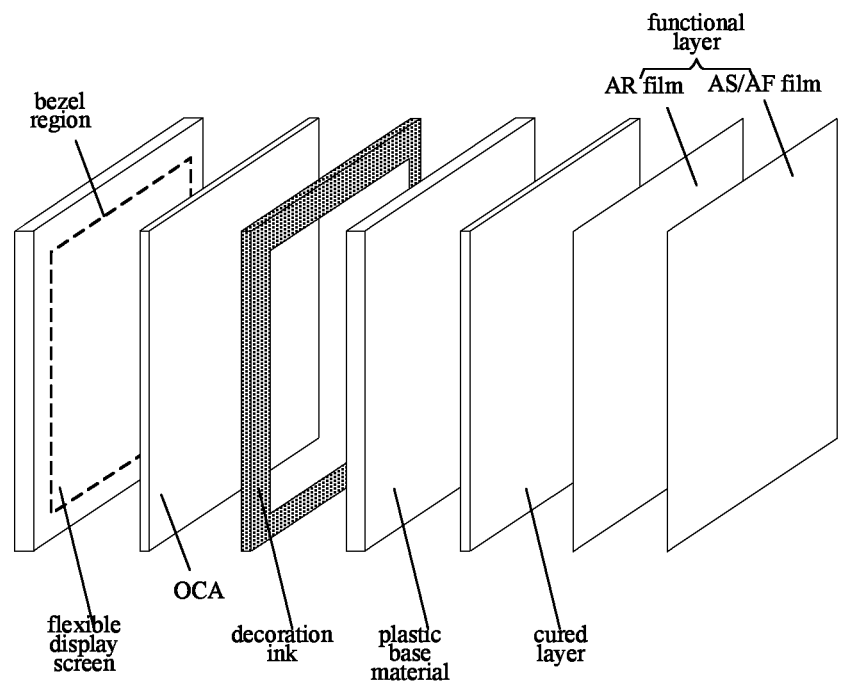
FIG. 1 is an exploded schematic diagram of a flexible display device.

For example, as shown in FIG. 1, a flexible display device includes a flexible display panel and a cover plate (also referred to as a protective cover plate) disposed oppositely to the flexible display panel. For example, the cover plate includes a plastic base material, and a cured coating layer with scratch resistance and function layers (e.g. an anti-reflection coating and an anti-fingerprint-and-scratch coating) formed sequentially on its surface, and black, white, or any other color of ink for decoration printed on its back side in the region corresponding to the border region of the flexible display panel to shield structures like circuits in the border region. The cover plate is bonded on its back side to the flexible display panel via OCA (Optically Clear Adhesive, a special type of adhesive for boding transparent optical elements).

Figure 2:
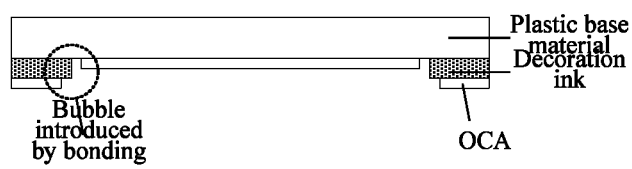
FIG. 2 is a first partially sectioned structure view of the flexible display device shown in FIG. 1 after bonding.
Figure 3:
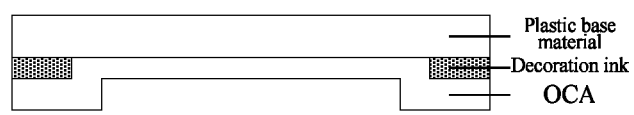
FIG. 3 is a second partially sectioned structure view of the flexible display device shown in FIG. 1 after bonding.

The inventor of the present application noticed in the research that when a thin layer of OCA is used to bond the cover plate to the flexible display panel, as shown in FIG. 2, it is difficult for a thinner layer of OCA to cover the edges of the ink for decoration due to the thickness of the ink, and bubbles may be resulted from the bonding at the edges, which can affect the whole appearance of the flexible display device. As shown in FIG. 3, a relatively thicker layer of OCA is required to achieve good boding effect, which increases the overall thickness of the display assembly.

Figure 4A:
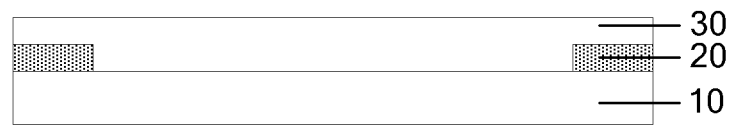
FIG. 4a is a partially sectioned structure view of a motherboard provided in an embodiment of the present invention.
Figure 4B:
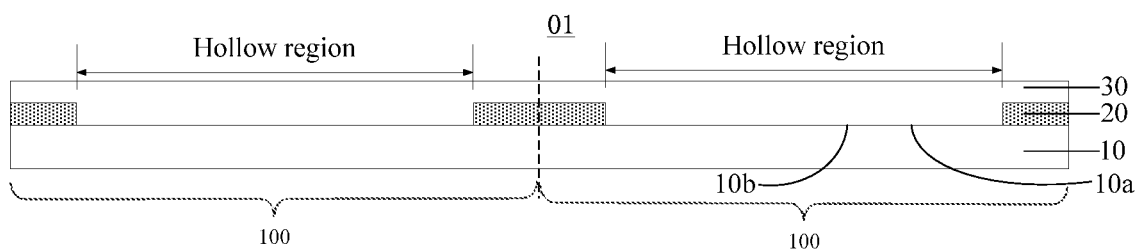
FIG. 4b is a partially sectioned structure view of a motherboard provided in an embodiment of the present invention.
Figure 4C:
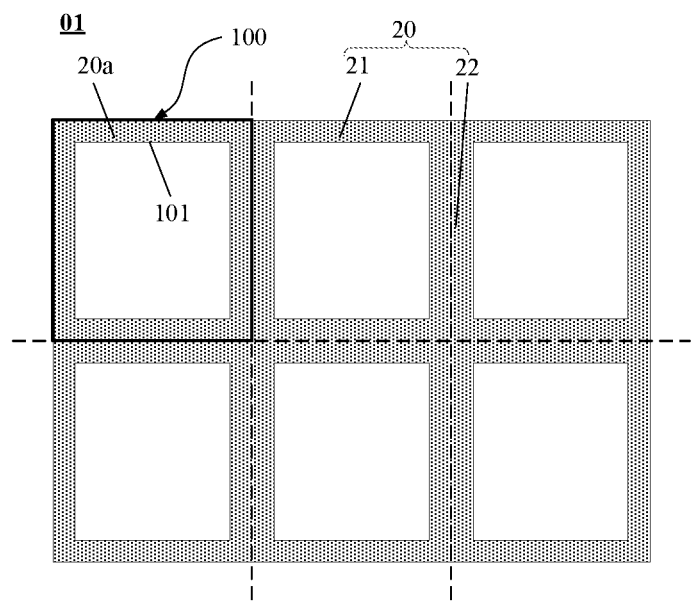
FIG. 4c is a schematic top view of the structure of a motherboard without a cured layer formed therein provided in an embodiment of the present invention.
Figure 5:
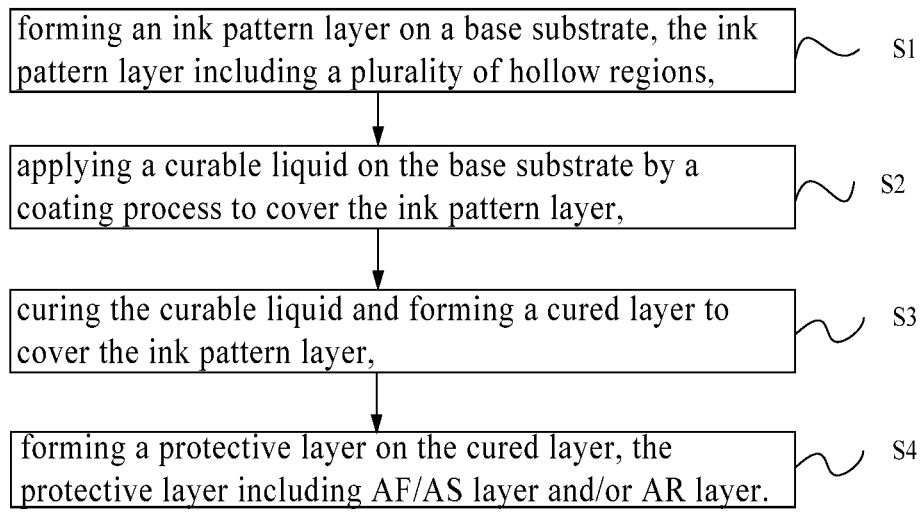
FIG. 5 is a flowchart of a manufacturing method of a motherboard provided in an embodiment of the present invention.
Figure 6:
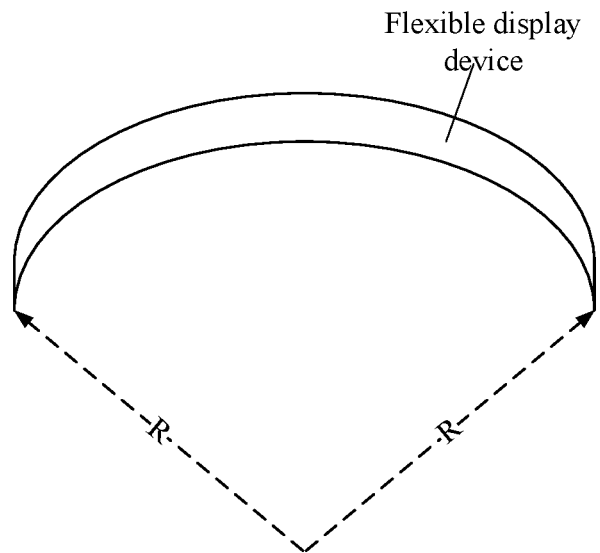
FIG. 6 is a schematic diagram illustrating the bending radius of a display device employing the cover plate provided in an embodiment of the present invention.

An embodiment of the present invention provides a method for manufacturing the motherboard 01 shown in FIGS. 4a-4c. As shown in FIG. 5, the manufacturing method includes: step S1, an ink pattern layer 20 is formed on a base substrate 10, the ink pattern layer 20 including a plurality of hollow regions; step S2, a curable liquid is applied onto the base substrate 10 to cover the ink pattern layer 20 by a coating process, for example; and step S3, the curable liquid is cured to form a cured layer 30 covering the ink pattern layer 20.

It is to be noted that the motherboard 01 is a whole base board to be divided into a plurality of small cover plates. After various layers have been formed on the base substrate 10, the motherboard may be cut into a plurality of cover plates, which facilitates batch production of display products.

For example, as shown in FIG. 4c, the planar shape of the ink pattern layer 20 is in a grid shape. The ink pattern layer 20 includes a plurality of first extending sections 21 and a plurality of second extending sections 22 crossing the plurality of first extending sections 21 and form a plurality of hollow regions so as to form a grid shaped structure. As shown in FIG. 4c, a motherboard may be divided into, for example, six cover plates 100 and the planar pattern of the ink pattern layer 20 in the motherboard 01 may be formed by a number of lateral sections and a number of longitudinal sections joining into the lateral sections, resulting in a pattern with six hollow regions. Each hollow region corresponds to the transmission region of each cover plate 100 after it is cut off the motherboard, and in a display device obtained by bonding a cover plate to a display panel, the transmission region corresponds to the display area of the display device. After the cured layer 30 covering the ink pattern layer 20 is formed on the base substrate 10, the motherboard 01 may be divided into six smaller cover plates 100 along cutting lines indicated by the dashed lines in the figure. That is to say, each cover plate 100 has an ink pattern 20a for decoration 20a formed in and to cover its border region 101 and each ink pattern 20a corresponds to a hollow region.

In this case, the number, distribution and pattern of the hollow regions in the above-mentioned ink pattern layer 20 is not limited in embodiments of the present invention.

The embodiments of the present invention provide a method for manufacturing a motherboard as described above, in which an ink pattern layer 20 for decoration is firstly formed on the upper surface 10a of the base substrate 10 and then a curable liquid is applied onto the base substrate 10 using, for example, a coating process to cover the ink pattern layer 20, so that the drop in level at the edges of the ink pattern layer 20 will be leveled up utilizing the fluidity of the curable liquid and the cured layer 30 as a cured coating formed by curing the curable liquid will be perfectly attached to the base substrate 10 and the ink pattern layer 20. Since the ink pattern layer 20 is formed on the upper surface 10a (the appearance surface, a surface nearer to the user) of the base substrate 10 and the lower surface 10b of the base substrate 10 (the surface for bonding the cover plate to the display panel) is flat without any drop in level, a relatively thin layer of OCA can be used for the bonding to the display panel, and a small overall thickness of the display assembly is achieved.

The steps above will be explained as follows.

For example, in step S1, the ink pattern layer 20 may be formed on the base substrate 10 using a decoration process. For example, the decoration process may include any process selected from screen printing, heat transfer printing, and wire drawing.

For example, in step S2, the coating process may include any process selected from slit coating, spraying, and spin coating. In step S2, any process other than coating processes may be used to apply the curable liquid layer.

For example, in step S3, if the curable liquid is photo-curable, it may be cured by, for example, UV irradiation to form the cured layer 30 covering the ink pattern layer 20.

For example, the photo-curable liquid may be an acrylic type material, a silicone type material, or any other organic composite material with a photo curing agent added therein. By using the photo curing agent's property of absorbing energy from the UV light and then generating active free radicals or cations when irradiated by the UV light, a series of photo-polymerization reactions may happen in the curable liquid to finally cure the curable liquid into a cured coating layer.

For example, in step S3, if the curable liquid is heat curable, it may be cured by heating it to form the cured layer 30 covering the ink pattern layer 20.

For example, the heat curable liquid may be a heat curable phenolic resin material that may be gradually cured through chemical transformations when being heated and will not softened if it is heated again.

For example, after the above-mentioned step S3, depending on further requirements of a user for the display device, the method may further include step S4, in which, as shown in FIG. 5, a protective layer is formed on the cured layer 30 (i.e., on the side of the cured layer 30 away from the ink layer 20 for decoration) subsequently. For example, the protective layer may include an anti-fingerprint-and-scratch (AF/AS) layer and/or an anti-reflection (AR) layer. For example, the coating process for the protective layer may include any process selected from thermal evaporation, electron beam evaporation, magnetron sputtering, and wet spraying.

For example, when the protective layer includes an AF/AS layer and an AR layer, the AF/AS layer may be disposed at the outmost layer of the base substrate 10 to prevent oil stains (e.g. fingerprints) from affecting the anti-reflection effect of the AR layer.

Based on the description above, an embodiment of the present invention also provides a motherboard 01 obtained by the manufacturing method described above, and the motherboard 01 includes a plurality of cover plates 100 to be separated. As shown in FIGS. 4a-4c, the motherboard 01 includes a base substrate 10, an ink pattern layer 20 disposed on the base substrate 10 and a cured layer 30 disposed on the base substrate 10 to cover the ink pattern layer 20, the ink pattern layer 20 including a plurality of hollow regions. For example, the cured layer 30 is adjacent to the ink pattern layer 20, and the whole upper surface (the surface away from the base substrate 10) of the cured layer 30 is planar.

In the embodiment of the present invention, since the ink pattern layer 20 is formed on the upper surface 10a of the base substrate 10 and the whole lower surface of the base substrate 10 is flat without any drop in level, a relatively thin layer of OCA may be used for the bonding to the display panel, which allows the display assembly to have a thinner overall thickness.

The various layers in the motherboard 01 are further explained in the following.

For example, the base substrate 10 is flexible and has a thickness in a range of 5~500 μm. Since the motherboard 01 obtained by the above-mentioned manufacturing method provided in the embodiments of the present invention has a flat lower surface without any drop in level (see the lower surface 10a of the base substrate 10), the cover plates obtained by dividing the motherboard 01 may be respectively bonded to flexible display panels using relatively thin layers of OCA, so that the resulted flexible display devices may have relatively thinner overall thicknesses and relatively small bending radii (as indicated by R in the figure) when bent.

For example, the flexible base substrate may include at least one material selected from a group consisting of polyethylene terephthalate (PET), polycarbonate (PC), triacetate cellulose (TAC), cycloolefin polymer (COP), polyimide (PI) and polyethylene naphthalate two formic acid glycolester (PEN).

For example, for the structures shown in FIGS. 1-3, if the plastic substrate is a polarizer sheet, it has an appearance that looks gray because of its typical transmittance of only 42%-44%; if it is intended to integrate the protective function of a cover plate with the function of a polarizer and, as shown in FIGS. 2 and 3, ink for decoration can be applied onto the back side of the polarizer, the color of the ink viewed from the side of the upper surface of the polarizer may be effected by the transmittance of the polarizer, so that it is difficult to realize a decoration effect by the white or any other color of ink, and only relatively dark colors of ink can be applied.

In the above-mentioned motherboard 01 provided in the embodiment of the present invention, the ink pattern layer 20 is above the base substrate 10 (i.e., on the viewing side of the base substrate 10, i.e. the side of the base substrate 10 away from the display panel) and will not be constrained by the transmittance of the polarizer. In this way, for example, in at least one embodiment of present invention, the base substrate 10 (e.g. a flexible base substrate) may also be a polarizer to integrate the polarizer into the cover plate, so that the structure of the cover plate is further simplified and the overall thickness of the display assembly is further decreased.

For example, the ink pattern layer 20 may be black, white, or any other color of ink, which can shield the opaque structures, such as circuits, in the border/bezel region of the display panel to achieve a decoration effect. The ink pattern layer 20 may have a thickness in a range of 5~50 μm.

For example, the cured layer 30 may include polymethyl methacrylate (i.e. acrylic), polyethylene terephthalate (PET), polyurethane (PU), silicone, any organic composite material, or the like, which has good adhesiveness to ink so as to fully level up the drop in level at edges of the ink pattern.

For example, the thickness of the cured layer 30 is determined by the performance parameters to be achieved and the drop in level of the ink, and no special limitation is provided in the embodiments of present invention.

For example, an embodiment of the present invention also provides a method for manufacturing a cover plate, which includes cutting the motherboard 01 described above into a plurality of cover plates. In this method, the cutting is performed along cutting lines between adjacent hollow regions.

For example, the cutting may be performed by a laser or a cutter wheel to form the plurality of cover plates.

An embodiment of the present invention also provides a cover plate 100 that includes an ink pattern 20a (as shown in FIG. 4c) disposed in the border region 101 (as shown in FIG. 4c) of a base substrate 10 and a cured layer 30 disposed on the base substrate 10 and covers the ink pattern 20a.

It is to be noted that the base substrate and the cured layer herein are the smaller pieces of base substrate and cured layer obtained by cutting the motherboard 01, and the forgoing description of various layers in the motherboard 01 may be referenced to for the materials and thicknesses of these base substrate and the cured layer pieces, and no description about them will be repeated herein.

For example, the cover plate may further include a protective layer disposed on the side of the cured layer 30 away from the base substrate 10, and the protective layer may include an AF/AS layer and/or an AR layer, for example.

Figure 7:
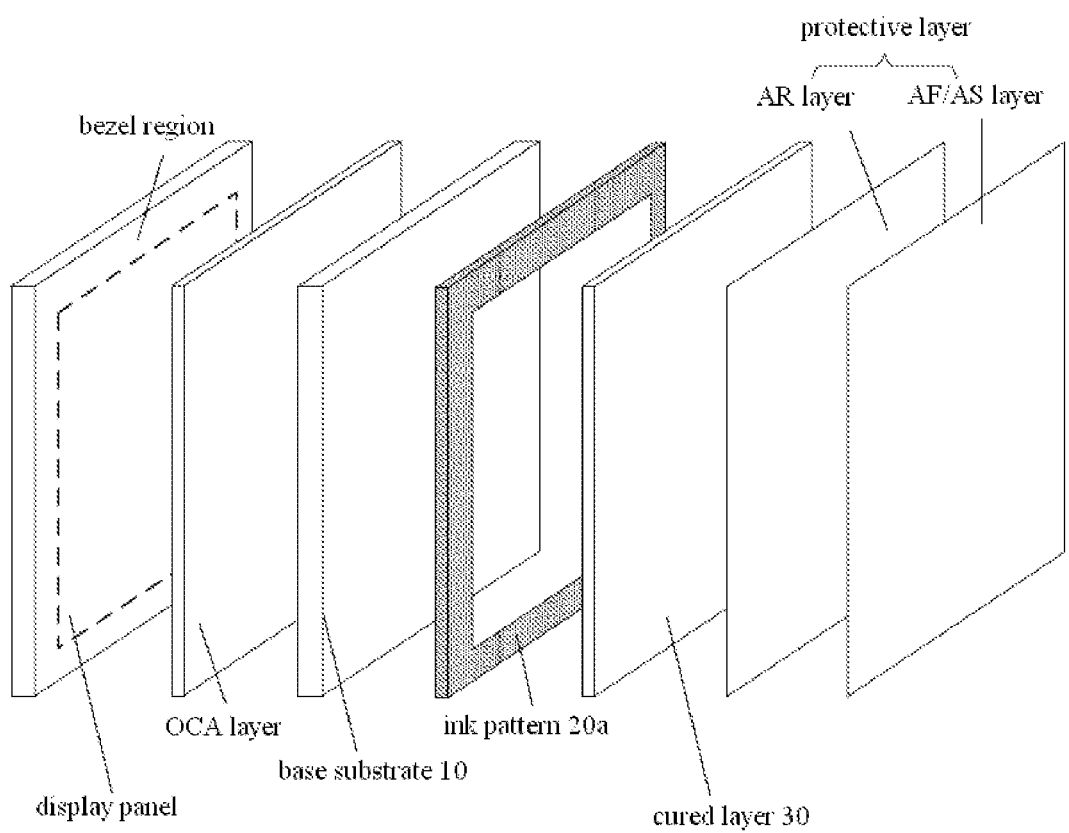
FIG. 7 is an exploded schematic diagram of a display device provided in an embodiment of the present invention.

An embodiment of the present invention also provides a display device including, as shown in FIG. 7, a display panel and the above-mentioned cover plate 100. The ink pattern 20a of the cover plate 100 corresponds to the border/bezel region of the display panel, the hollow region surrounded by the ink pattern 20a corresponds to the whole display area of the display panel, and the adhesive (e.g. OCA) layer for bonding the cover plate 100 and the display panel is disposed on the side of the base substrate 10 of the cover plate 100 away from the ink pattern 20a.

In an embodiment of the present invention, the ink pattern 20a and the adhesive layer are respectively on opposite sides, rather than the same side, of the base substrate, the ink pattern 20a is disposed on the upper surface of the base substrate 10 of the cover plate 100 and the lower surface of the cover plate is flat without any drop in level, so that a relatively thin layer of OCA may be used to bond the cover plate and the display panel, which permits the display assembly to have a relatively small overall thickness.

For example, the display panel may include an array substrate including a plurality of pixel regions, an opposed substrate disposed oppositely to the array substrate, and a connection part to connect the array substrate and the opposed substrate together. For example, a liquid crystal layer or a plurality of active light-emitting elements (e.g. organic electroluminescent elements) may be disposed between the array substrate and the opposed substrate.

For example, the display device may be a liquid crystal panel, a liquid crystal display, a liquid crystal TV, an organic electroluminescent display panel, an organic electroluminescent display, an electronic paper, a digital picture frame or the like.

For example, the display device may be a flexible display device, this may allow the display device to be bent with an even smaller bending radius, and expand the usage requirements that the flexible display device can satisfy.

In summary, in embodiments of the present invention, an ink pattern layer for decoration is firstly prepared on the upper surface of a base substrate and then the curable liquid is applied onto the base substrate by using, for example, a coating process to cover the ink pattern layer, so that the drop in level at the edges of the ink pattern layer will be leveled up by utilizing the flowability of the curable liquid, and the cured layer as a cured coating formed by curing the curable liquid will be perfectly attached to the base substrate and the ink pattern layer. Since the ink pattern layer is formed on the upper surface of the base substrate and the lower surface of the base substrate is flat without any drop in level, a relatively thin layer of OCA may be used for the bonding to the display panel, which permits the display assembly to have a thinner overall thickness.

The described above are only exemplary embodiments of the present invention, and the present invention is not limited thereto. The scope of the present invention is defined by the claims.

The present application claims priority of Chinese patent application No. 201710020981.X filed on Jan. 12, 2017, which is incorporated herein by reference in its entirety as part of the present application.

What is claimed is:

1. A display device, comprising:
    a display panel;
    an adhesive layer provided on the display panel; and
    a cover plate to cover the adhesive layer, wherein the cover plate comprises:
        a base substrate provided on the adhesive layer, wherein the adhesive layer directly contacts each of the base substrate and the display panel;
        an ink pattern provided in an border region of the base substrate, wherein the ink pattern protrudes from the base substrate; and
        a cured layer provided on the base substrate to cover the ink pattern, wherein the cured layer comprises a first portion provided directly on the ink pattern and a second portion other than the first portion, a thickness of the first portion is smaller than a thickness of the second portion, and a surface, away from the base substrate, of the first portion is flush with a surface, away from the base substrate, of the second portion;
    wherein the base substrate is a flexible base substrate, the flexible base substrate comprising at least one material selected from the group consisting of triacetate cellulose, cycloolefin polymer, and polyimide.

2. The display device according to claim 1, wherein the flexible base substrate is a polarizer.

3. The display device according to claim 1, wherein the base substrate has a thickness in a range of 5~500 μm.

4. The display device according to claim 1, wherein the ink pattern has a thickness in a range of 5~50 μm.

5. The display device according to claim 1, wherein the cured layer comprises at least one material selected from the group consisting of polymethyl methacrylate, polyethylene terephthalate, polyurethane, silicone, and organic composite materials.

6. A display device, comprising:
    a display panel;
    an adhesive layer provided on the display panel; and
    a cover plate to cover the adhesive layer, wherein the cover plate comprises:
        a base substrate provided on the adhesive layer, wherein the adhesive layer directly contacts each of the base substrate and the display panel;
        an ink pattern provided in an border region of the base substrate, wherein the ink pattern protrudes from the base substrate;
        a cured layer provided on the base substrate to cover the ink pattern, wherein the cured layer comprises a first portion provided directly on the ink pattern and a second portion other than the first portion, a thickness of the first portion is smaller than a thickness of the second portion, and a surface, away from the base substrate, of the first portion is flush with a surface, away from the base substrate, of the second portion;
        an anti-reflection layer, provided on a side of the cured layer away from the base substrate; and
        an anti-fingerprint-and-scratch layer, provided on a side of the anti-reflection layer away from the base substrate to sever as an outmost layer of the cover plate;
    wherein the base substrate is a flexible base substrate, the flexible base substrate comprising at least one material selected from the group consisting of triacetate cellulose, cycloolefin polymer, and polyimide.

7. The display device according to claim 6, wherein the flexible base substrate is a polarizer.

8. The display device according to claim 6, wherein the base substrate has a thickness in a range of 5~500 μm.

9. The display device according to claim 6, wherein the ink pattern has a thickness in a range of 5~50 μm.

10. The display device according to claim 6, wherein the cured layer comprises at least one material selected from the group consisting of polymethyl methacrylate, polyethylene terephthalate, polyurethane, silicone, and organic composite materials.

* * * * *